US012681062B2

(12) United States Patent
Cui et al.

(10) Patent No.:    US 12,681,062 B2
(45) Date of Patent:        Jul. 14, 2026

(54) POWER METER WITH INDIVIDUAL CHANNEL CONFIGURATION

(71) Applicant: Accuenergy (Canada) Inc., Toronto (CA)

(72) Inventors: Shaohang Cui, Toronto (CA); Yufan Wang, Toronto (CA); Ketao Li, Toronto (CA); Liang Wang, Toronto (CA)

(73) Assignee: Accuenergy (Canada) Inc. (CA)

( * ) Notice: Subject to any disclaimer, the term of this patent is extended or adjusted under 35 U.S.C. 154(b) by 319 days.

(21) Appl. No.: 18/518,984

(22) Filed: Nov. 25, 2023

(65)                Prior Publication Data

US 2025/0172593 A1      May 29, 2025

(51) Int. Cl.
   *G01R 21/133*          (2006.01)
   *G01R 22/06*           (2006.01)
   *H03M 1/38*            (2006.01)

(52) U.S. Cl.
   CPC ......... *G01R 21/133* (2013.01); *G01R 22/061* (2013.01); *H03M 1/38* (2013.01)

(58) Field of Classification Search
   CPC ...... G01R 21/133; G01R 22/061; H03M 1/38
   USPC ............................................... 324/140 R, 127
   See application file for complete search history.

(56)                References Cited

U.S. PATENT DOCUMENTS 6,112,158  A  *   8/2000  Bond ...................... G06Q 50/06
                                                             340/657
10,830,801 B2 *  11/2020  Voisine ................... H01F 38/34

2004/0059469 A1*   3/2004  Hart ................... H02J 13/00034
                                                             700/291
2011/0089934 A1*   4/2011  King ...................... G01R 21/06
                                                             324/141
2012/0078555 A1*   3/2012  Banhegyesi ......... G01R 21/133
                                                             702/64
2020/0292597 A1*   9/2020  Minciunescu ....... G01R 21/001
2021/0382097 A1    12/2021  Minciunescu et al.

* cited by examiner

*Primary Examiner* — Arleen M Vazquez
*Assistant Examiner* — Robert P Alejnikov, Jr.
(74) *Attorney, Agent, or Firm* — Dhiraj Jindal; PATENT YOGI LLC

(57)                ABSTRACT

The present invention pertains to a power meter designed for monitoring and measuring the electrical parameters of power as it is distributed from an electrical distribution system to various loads. The power meter includes one or more sensors for detecting electrical parameters, such as current and voltage, and at least one analog-to-digital converter that transforms the analog signals from the sensors into digital data. A processing module, in communication with the analog-to-digital converter, is configured to access channel configuration data from a memory source. This channel configuration data establishes a relationship between each current input channel and a corresponding configured voltage. Utilizing this configuration, the processing module calculates various electrical parameters for each input channel based on the corresponding voltage and the current flowing through it. The invention thus allows for precise monitoring and computational assessment of power usage and can be tailored to specific applications through customized channel configurations.

10 Claims, 11 Drawing Sheets

100

300

400

| Independent wiring mode setting   402 | | | |
|---|---|---|---|
| input channel 1 matching voltage | $V_{BN}$ ⇩ | input channel 2 matching voltage | $V_{CA}$ ⇩ |
| input channel 3 matching voltage | $V_{AN}$ ⇧ | input channel 4 matching voltage | $V_{BC}$ ⇩ |

Summation 1 Config 404

☐ input channel 1                ☑ input channel 2

☑ input channel 3                ☐ input channel 4

Summation 2 Config 404

☑ input channel 1                ☑ input channel 2

☑ input channel 3                ☑ input channel 4

FIG. 4

| Independent wiring mode setting 602 | | | |
|---|---|---|---|
| input channel 1 matching voltage | $V_{BN}$ | input channel 2 matching voltage | $V_{CA}$ |
| input channel 3 matching voltage | $V_{AN}$ | input channel 4 matching voltage | $V_{BC}$ |
| Summation 1 Config | | Channel 2 + Channel 3 | |
| Summation 2 Config | | Channel 1 + Channel 2 + Channel 3 + Channel 4 | |

| Real time reading 604 | | | | | | |
|---|---|---|---|---|---|---|
| Parameter | Input channel 1 | Input channel 2 | Input channel 3 | Input channel 4 | Summation 1 | Summation 2 |
| current | 4.999A | 4.999A | 4.999A | 4.999A | 4.999A | 4.999A |
| active power | -0.300kW | 0.900kW | 0.900kW | -0.900kW | 1.799kW | 0.600kW |
| reactive power | -0.519kvar | 0.519kvar | 0.519kvar | 0.519kvar | 1.039kvar | 1.039kvar |
| apparent power | 0.600kVA | 1.039kVA | 1.039kVA | 1.039kVA | 2.078kVA | 3.716kVA |
| power factor | -0.500 | 0.866 | 0.866 | -0.866 | 0.866 | 0.161 |
| Load type | L | L | L | L | L | L |

Figure 7:
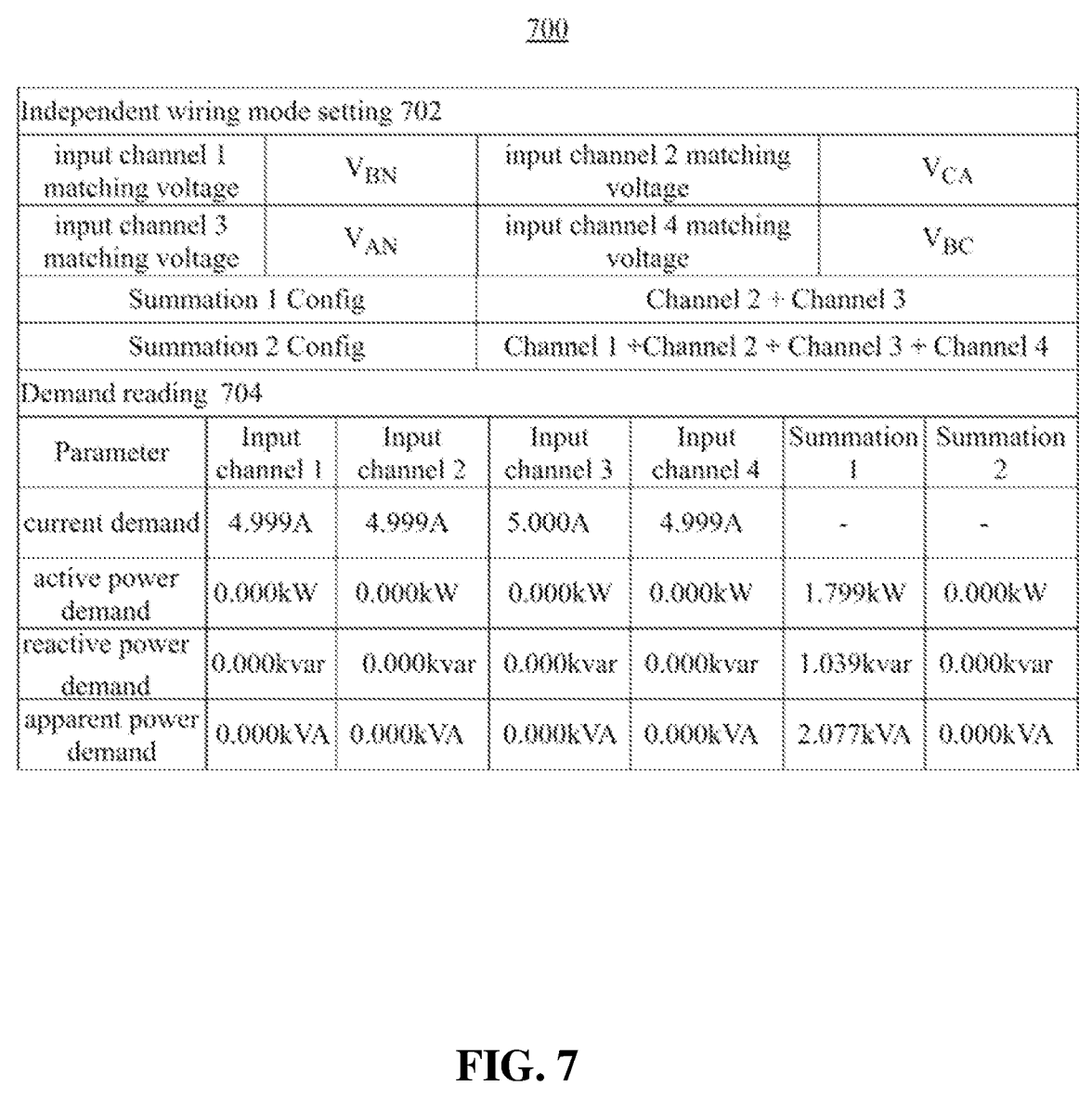

| Independent wiring mode setting 702 | | | |
|---|---|---|---|
| input channel 1 matching voltage | $V_{BN}$ | input channel 2 matching voltage | $V_{CA}$ |
| input channel 3 matching voltage | $V_{AN}$ | input channel 4 matching voltage | $V_{BC}$ |
| Summation 1 Config | | Channel 2 + Channel 3 | |
| Summation 2 Config | | Channel 1 + Channel 2 + Channel 3 + Channel 4 | |

| Demand reading 704 | | | | | | |
|---|---|---|---|---|---|---|
| Parameter | Input channel 1 | Input channel 2 | Input channel 3 | Input channel 4 | Summation 1 | Summation 2 |
| current demand | 4.999A | 4.999A | 5.000A | 4.999A | - | - |
| active power demand | 0.000kW | 0.000kW | 0.000kW | 0.000kW | 1.799kW | 0.000kW |
| reactive power demand | 0.000kvar | 0.000kvar | 0.000kvar | 0.000kvar | 1.039kvar | 0.000kvar |
| apparent power demand | 0.000kVA | 0.000kVA | 0.000kVA | 0.000kVA | 2.077kVA | 0.000kVA |

| Independent wiring mode setting 802 | | | |
|---|---|---|---|
| input channel 1 matching voltage | $V_{BN}$ | input channel 2 matching voltage | $V_{CA}$ |
| input channel 3 matching voltage | $V_{AN}$ | input channel 4 matching voltage | $V_{BC}$ |
| Summation 1 Config | | Channel 2 + Channel 3 | |
| Summation 2 Config | | Channel 1 +Channel 2 + Channel 3 + Channel 4 | |

Energy reading 804

| Parameter | Input channel 1 | Input channel 2 | Input channel 3 | Input channel 4 | Summation 1 | Summation 2 |
|---|---|---|---|---|---|---|
| import active energy | 0.000kWh | 1.463kWh | 1.463kWh | 0.000kWh | 2.926kWh | 2.927kWh |
| export active energy | 0.487kWh | 0.000kWh | 0.000kWh | 1.446kWh | 0.000kWh | 1.934kWh |
| total active energy | - | - | - | - | 2.926kWh | 4.862kWh |
| net active energy | - | - | - | - | 2.926kWh | 0.993kWh |
| import reactive energy | 0.000kvarh | 0.844kvarh | 0.844kvarh | 0.836kvarh | 1.688kvarh | 2.525kvarh |
| export reactive energy | 0.844kvarh | 0.000kvarh | 0.000kvarh | 0.000kvarh | 0.000kvarh | 0.844kvarh |
| total reactive energy | - | - | - | - | 1.688kvarh | 3.369kvarh |
| net reactive energy | - | - | - | - | 1.688kvarh | 1.681kvarh |
| total apparent energy | - | - | - | - | 3.379kVAh | 6.028kVAh |

| Independent wiring mode setting 902 | | | |
|---|---|---|---|
| input channel 1 matching voltage | $V_{BN}$ | input channel 2 matching voltage | $V_{CA}$ |
| input channel 3 matching voltage | $V_{AN}$ | input channel 4 matching voltage | $V_{BC}$ |
| Summation 1 Config | | Channel 2 + Channel 3 | |
| Summation 2 Config | | Channel 1 +Channel 2 + Channel 3 + Channel 4 | |

| Max/Min 904 | | | | |
|---|---|---|---|---|
| Channel | Maximum | Time Stamp | Minimum | Time Stamp |
| Input channel 1 current | 27.602A | 2023-09-21-15:20:58 | 0.000A | 2023-09-18-15:00:13 |
| Input channel 2 current | 27.601A | 2023-09-21-15:20:58 | 0.000A | 2023-09-18-15:00:13 |
| Input channel 3 current | 27.601A | 2023-09-21-15:20:58 | 0.000A | 2023-09-18-15:00:13 |

Independent wiring mode

POWER METER WITH INDIVIDUAL CHANNEL CONFIGURATION

FIELD OF THE INVENTION

The present disclosure generally relates to the field of power meters for electrical utility services and, more specifically, to power meter with individual channel configuration.

BACKGROUND OF THE INVENTION

In various industrial, commercial, and other facilities having substantial electrical loads, the accurate measurement and monitoring of power usage become critical. One such measuring device extensively employed is the three-phase power meter, tailored specifically for three-phase electrical systems.

Referring to FIG. 1, a typical three-phase electrical system 100 is depicted where a three-phase power meter, labeled 102, quantifies parameters encompassing active power, reactive power, apparent power, energy consumption, etc. The current flowing through conductor 120 from phase A is gauged using the current transformer 130, subsequently channeled to terminals $I_{A1}$ and $I_{A2}$. Similarly, the current flowing through conductor 122 for phase B is ascertained by current transformer 132 and directed to terminals $I_{B1}$ and $I_{B2}$, while current transformer 134 measures the current flowing through conductor 124 of phase C, routing it to terminals $I_{C1}$ and $I_{C2}$. The voltages from phases A, B, and C are respectively connected to terminals $V_A$, $V_B$, and $V_C$.

For clarity and simplicity, the designations 'phase A', 'phase B', and 'phase C' can be interchangeably used with 'channel A', 'channel B', and 'channel C'. In the present configuration of the three-phase power meter 102, some parameters such as power and energy computations rely on pre-defined channel pairs. Specifically, the pair comprising voltage from terminal $V_A$ and current from terminals $I_{A1}$ and $I_{A2}$ is recognized as the 'channel A' pair. Analogously, voltage from terminal $V_B$ combined with current from terminals $I_{B1}$ and $I_{B2}$ forms the 'channel B' pair, and voltage from terminal $V_C$ paired with current from terminals $I_{C1}$ and $I_{C2}$ constitutes the 'channel C' pair. Meter 102 employs these channel pairs to compute power and energy metrics for each respective channel.

Nevertheless, such rigid channel pairings can introduce complications. For instance, if a technician inadvertently misroutes the wiring, it could result in errors. It is, therefore, advantageous to introduce a three-phase power meter capable of accommodating configurable channel pairs, thus offering enhanced flexibility, and reducing potential errors in power and energy measurements.

SUMMARY OF THE INVENTION

The present invention relates to a power meter designed to measure electrical parameters in electrical distribution systems. This power meter is equipped with at least one sensor to detect electrical parameters such as current, voltage, power, and energy. The sensed analog signals are converted to digital data by at least one analog-to-digital converter. A processing module, in communication with the analog-to-digital converter, is responsible for executing several critical functions.

The processing module retrieves a channel configuration from a memory which associates each current input channel with a specific voltage configuration. This enables the computation of various electrical parameters for each channel based on the actual measured voltage and current. The power meter can function as either a three-phase power meter or a multi-channel power meter, enhancing its versatility in application.

The processing module also has the capability to access a summation configuration from the memory, which specifies a subset of input channels for aggregate computation. This feature allows for the calculation of cumulative electrical parameters, providing a comprehensive analysis of the power distribution to the load.

A user interface is incorporated into the power meter, providing users with the ability to customize the channel configuration and summation settings according to the specific needs of the electrical distribution system. The user interface also displays the computed electrical parameters, facilitating easy monitoring and management of power distribution.

The power meter further allows users to enable or disable the channel configuration via the user interface. When disabled, the power meter defaults to using predefined channel pairs for measurements, and when enabled, it operates in a customized channel configuration mode, thereby offering adaptability to a range of measurement scenarios.

In addition, the invention encompasses a method for measuring electrical parameters within an electrical distribution system. The method includes the steps of sensing, converting, retrieving configurations, and computing parameters, reflective of the features and functionalities of the power meter. This method ensures that users can customize and optimize the power meter's operation for enhanced accuracy and efficiency in various electrical environments.

This power meter and method offer significant advantages, including flexibility in configuration, precise measurement of a wide range of electrical parameters, and the ability to adapt to different electrical distribution system requirements. These aspects make the invention a valuable tool for managing and monitoring electrical power in both commercial and industrial settings.

BRIEF DESCRIPTION OF THE DRAWINGS

The forgoing and other advantages of the present disclosure will become apparent upon reading the following detailed description and upon reference to the drawing.

FIG. 4 is a user interface featuring drop-down list boxes and check boxes, facilitating channel configuration for a three-phase power meter, according to some embodiments of the present invention.

FIG. 6 is an exemplary user interface that showcases the current independent wiring mode setting corresponding to the configuration described in FIG. 4 and real time reading for each input channel, according to some embodiments of the present invention.

FIG. 7 is an exemplary user interface that showcases the current independent wiring mode setting corresponding to the configuration described in FIG. 4 and demand reading for each input channel, according to some embodiments of the present invention.

FIG. 8 is an exemplary user interface that showcases the current independent wiring mode setting corresponding to the configuration described in FIG. 4 and energy reading for each input channel, according to some embodiments of the present invention.

FIG. 9 is an exemplary user interface that showcases the current independent wiring mode setting corresponding to the configuration described in FIG. 4 and energy reading for each input channel, according to some embodiments of the present invention.

DETAIL DESCRIPTIONS OF THE INVENTION

The following description should be read with reference to the drawings, in which like elements in different drawings are numbered in like fashion. The drawings, which are not necessarily to scale, depict selected embodiments and are not intended to limit the scope of the invention. Although examples of construction, dimension, and materials are illustrated for the various elements, those skilled in the art will recognize that many of the examples provided have suitable alternatives that may be utilized.

Figure 2:
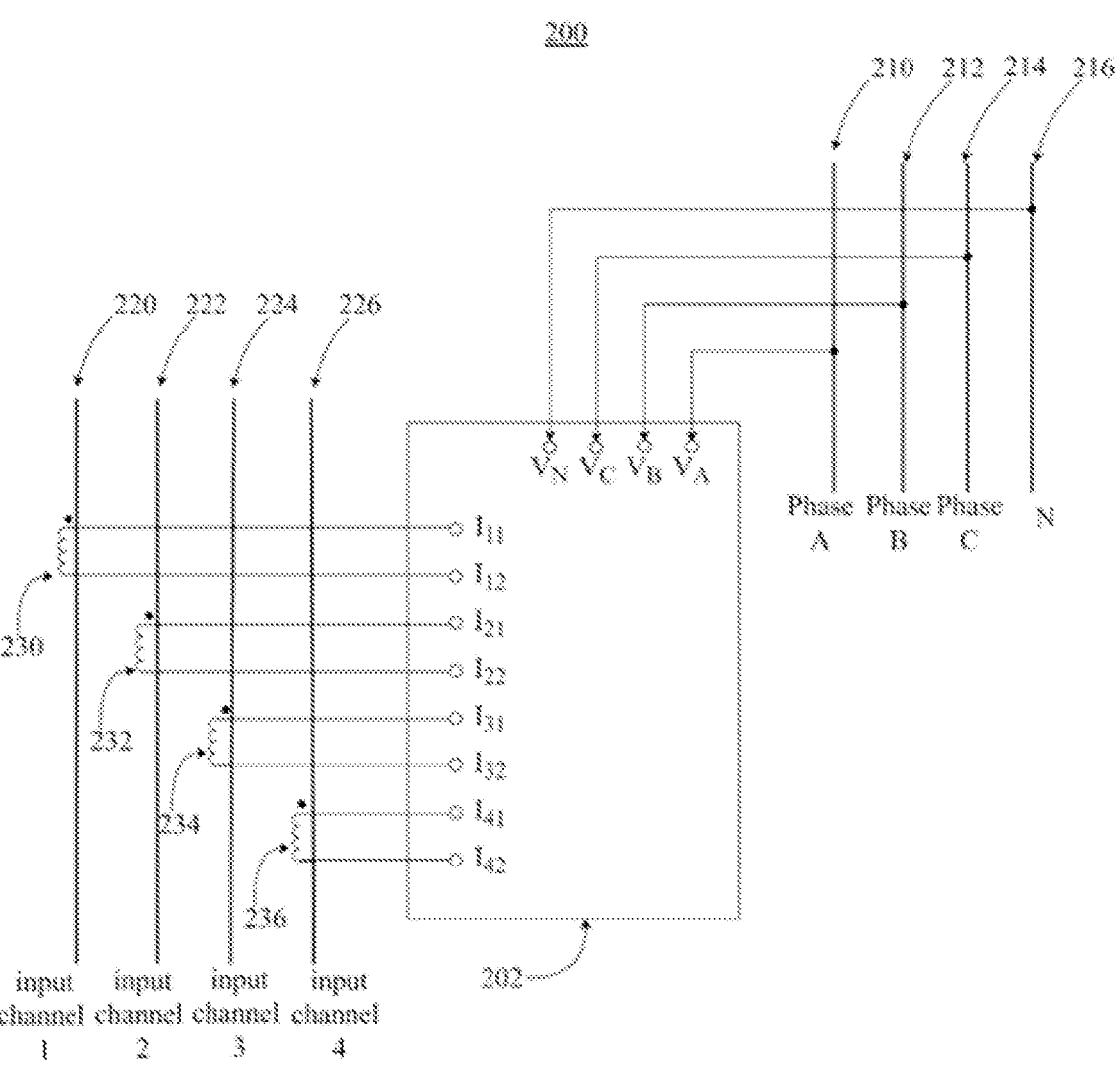
FIG. 2 is a diagram of a three-phase electrical distribution system, showcasing three-phase power meter measuring parameters according to some embodiments of the present invention.

FIG. 2 illustrates a diagram of a three-phase electrical distribution system 200, demonstrating three-phase power meter measuring parameters in accordance with some embodiments of the present invention. In the depicted system 200:

Voltage input terminals $V_A$, $V_B$, and $V_C$ are directly connected to conductors 210, 212, and 214 respectively, facilitating the measurement of voltages in phases A, B, and C. Additionally, voltage input terminal $V_N$ is directly connected to conductor 216, enabling the measurement of the voltage of the neutral wire 216.

Current flow through various conductors is also meticulously measured. Specifically, the current traversing through conductor 220 from input channel 1 is measured by current transformer 230 and directed to current input terminals $I_{11}$ and $I_{12}$.

In a similar vein, current transformer 232 assesses the current traversing through conductor 222 from input channel 2, directing it to current input terminals $I_{21}$ and $I_{22}$.

For input channel 3, current transformer 234 gauges the current flowing through conductor 224, routing these measurements to current input terminals $I_{31}$ and $I_{32}$.

For input channel 4, current transformer 236 captures the current flow metrics from conductor 226, directing this data to current input terminals $I_{41}$ and $I_{42}$.

This structured configuration allows for comprehensive monitoring and measurement of voltage and current parameters across multiple channels and phases of the three-phase electrical system.

It should be highlighted that any input channel, from 1 to 4, can correspond to either a line-to-line voltage or a line-to-neutral voltage within a three-phase electrical system. In this context, the voltage corresponding to a specific input channel can be termed as the 'input channel matching voltage'.

Figure 3:
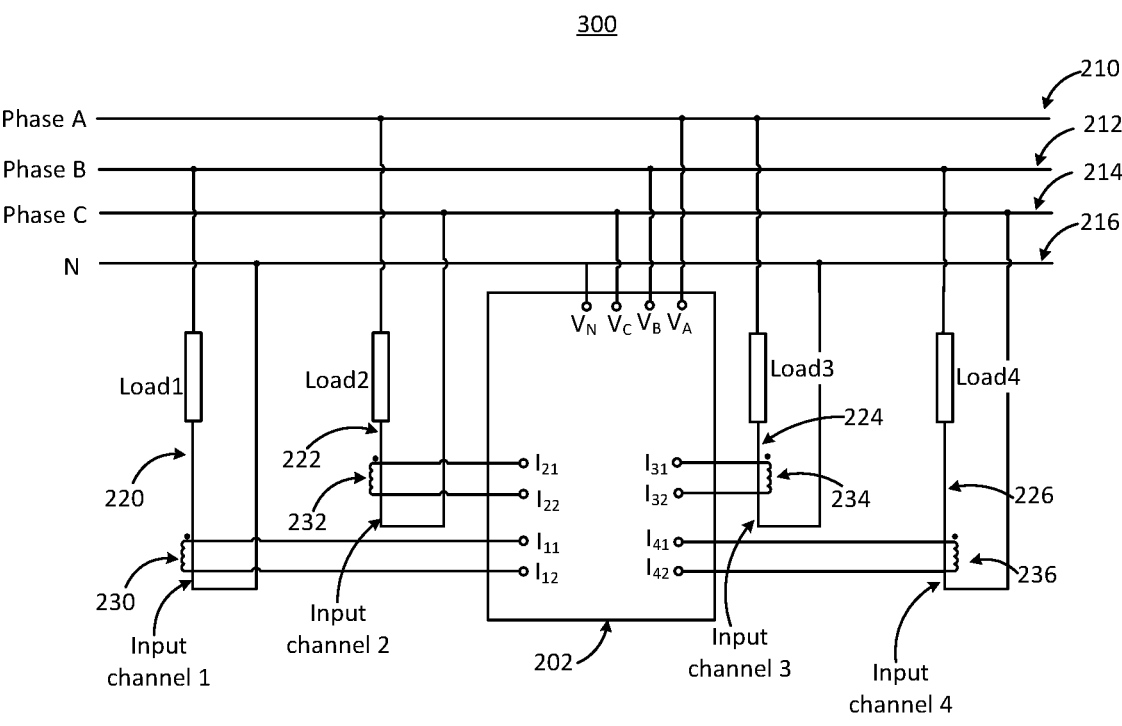
FIG. 3 is a diagram of an exemplary three-phase electrical distribution system, showcasing three-phase power meter measuring parameters according to some embodiments of the present invention.

For instance, referring to FIG. 3:

The matching voltage for input channel 1 is identified as the line-to-neutral voltage $V_{BN}$.

For input channel 2, the matching voltage is recognized as the line-to-line voltage $V_{AC}$.

Input channel 3's matching voltage is denoted as the line-to-neutral voltage $V_{AN}$.

Lastly, the matching voltage associated with input channel 4 is the line-to-line voltage $V_{BC}$.

This terminology and designation facilitate a clearer understanding and reference to the voltages associated with each respective input channel in the three-phase electrical distribution system.

FIG. 4 illustrates the user interface featuring drop-down list boxes and check boxes, facilitating channel configuration for a three-phase power meter. Users are provided with the flexibility to configure their input channel matching voltages via drop-down list boxes 402, tailoring the settings according to specific application requirements. Furthermore, check boxes 404 allow users to enable the summation feature for two or more input channels, providing an aggregated data view. It should be noted that check boxes 404 is optional in FIG. 4.

The channel configuration options, embodied by drop-down list boxes 402 and check boxes 404, can be seamlessly accessed on the display of the three-phase power meter 202. Additionally, these configuration controls are accessible remotely via the internal webserver of the three-phase power meter 202, offering enhanced accessibility and user convenience in meter configuration and management.

Within the user interface, drop-down list boxes 402 are provided, enabling users to specify a particular matching voltage for each input channel. For instance, as illustrated in drop-down list boxes 402, a user has designated the line-to-neutral voltage $V_{BN}$ as the matching voltage for input channel 1 and the line-to-line voltage $V_{CA}$ as the matching voltage for input channel 2. These user-defined matching voltage selections for the input channels are recorded and preserved in the power meter 202's memory within a channel configuration file. It is pertinent to observe that each input channel matching voltage depicted in FIG. 4 corresponds to the exemplary three-phase electrical system 300 as illustrated.

Moreover, check boxes 404 allow users to define one or more summation configurations. As indicated in the check boxes 404, the user has chosen to group input channel 2 and input channel 3 for combined parameter calculations, as well as to collectively consider input channel 1, input channel 2, input channel 3, and input channel 4 as another grouping for summation purposes. These selections delineate the subsets of input channels that are targeted for aggregate computation and are similarly stored in the memory of power meter 202 within a summation configuration file.

Upon user configuration of the corresponding matching voltage for each input channel, the processing module housed within the power meter 202 accesses both the channel configuration file and the summation configuration file from its internal memory. Subsequently, power meter 202 calculates electrical parameters for each individual channel utilizing the specified matching voltage and the current traversing the pertinent input channel. Additionally, power meter 202 computes an aggregated electrical parameter by summing the electrical parameters across the designated subset of input channels, in accordance with the stipulations set forth in the summation configuration.

Figure 5:
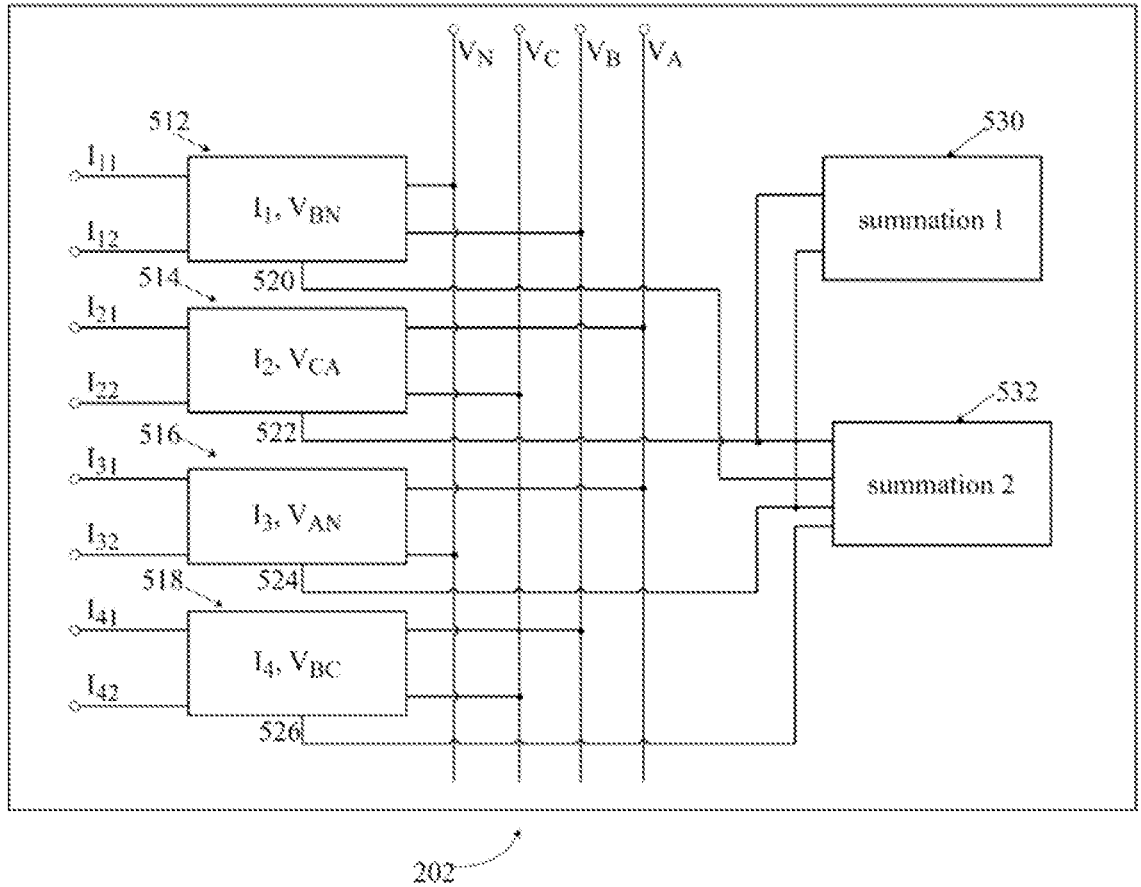
FIG. 5 is a logic diagram representing the implementation of channel configuration in the three-phase power meter, corresponding to the configuration depicted in FIG. 4, according to some embodiments of the present invention.

FIG. 5 illustrates a logic diagram representing the implementation of channel configuration in the three-phase power meter 202, corresponding to the configuration depicted in FIG. 4.

Within the three-phase power meter 202, four modules (512, 514, 516, and 518) are designated to calculate electrical parameters such as active power, reactive power, and apparent power for customized input channel pairs. These modules can be embodied as software algorithms executed by the processing module within the power meter 202.

For instance, in module 512, active power $P_1$, reactive power $Q_1$ and apparent power $S_1$ for input channel 1 are computed as follows:

$$P_1 = V_{BN}I_1\cos\phi$$

$$Q_1 = V_{BN}I_1\sin\phi$$

$$S_1 = V_{BN}I_1$$

Here, $I_1$ represents the current through load 1 in FIG. 3, $V_{BN}$ denotes the voltage across load 1 in FIG. 3, and ø is the phase difference between the voltage and current. $I_1$ and $V_{BN}$ can be measured using the digital data generated by an analog-to-digital converter 1004 shown in FIG. 10.

Modules 514, 516, and 518 operate similarly, calculating respective powers for input channels 2, 3, and 4. In module 514, active power $P_2$, reactive power $Q_2$ and apparent power $S_2$ for input channel 2 are computed. In module 516, active power $P_3$, reactive power $Q_3$ and apparent power $S_3$ for input channel 3 are computed. In module 518, active power $P_4$, reactive power $Q_4$ and apparent power $S_4$ for input channel 4 are computed.

Subsequently, module 530 calculates the summation of parameters from input channels 2 and 3, given by:

$$P_{sum1} = P_2 + P_3$$

$$Q_{sum1} = Q_2 + Q_3$$

$$S_{sum1} = S_2 + S_3$$

Module 532 computes the combined power parameters of all input channels, expressed as:

$$P_{sum2} = P_1 + P_2 + P_3 + P_4$$

$$Q_{sum2} = Q_1 + Q_2 + Q_3 + Q_4$$

$$S_{sum1} = S_1 + S_2 + S_3 + S_4$$

Each sum, $P_{sum1}$, $Q_{sum1}$, $S_{sum1}$, $P_{sum2}$, $Q_{sum2}$ and $S_{sum1}$ represents the aggregated power parameters, enabling a comprehensive analysis of power and energy in the electrical system.

In addition to computing the active power $P_1$, reactive power $Q_1$, and apparent power $S_1$ for channel 1, the three-phase power meter 202 is also designed to calculate a variety of other parameters. These include, but are not limited to, demand and energy parameters for each respective channel as well as the summation of these parameters across multiple channels. Once these calculations are complete, the parameters are displayed to the user in a manner that reflects the independent wiring mode. This mode of display, as illustrated in FIG. 6 through FIG. 9, allows users to clearly interpret the electrical characteristics of each channel separately and the combined characteristics of the system, thereby providing a comprehensive understanding of the wiring configuration and the associated electrical measurements. This mode not only enhances the user's understanding of the power system's performance but also facilitates more informed decision-making in managing electrical resources. The system's capability to determine a wide array of parameters, including demand and energy metrics, further accentuates its utility. This comprehensive assessment, as facilitated by the present invention, is crucial for modern electrical systems where monitoring and optimizing power usage are imperative for operational efficiency and energy conservation.

FIG. 6 presents a user interface 600 that showcases the current independent wiring mode setting 602, which aligns with the configuration detailed in FIG. 4. Additionally, the interface provides real-time readings 604 for this configuration, which include the current, active power, reactive power, apparent power, power factor, load type for each input channel, and their cumulative values, as contemplated by some embodiments of the invention.

FIG. 7 depicts the user interface 700 featuring the current independent wiring mode setting 702, also in accordance with the configuration described in FIG. 4. This interface further displays demand readings 704 for this configuration, capturing current demand, active power demand, reactive power demand, and apparent power demand for each input channel, alongside their aggregated readings, according to some embodiments of the present invention.

FIG. 8 displays the user interface 800 which encompasses the current independent wiring mode setting 802, reflecting the configuration depicted in FIG. 4. The interface presents energy readings 804 tailored to this specific configuration, offering insights on import active energy, export active energy, total active energy, net active energy, import reactive energy, export reactive energy, total reactive energy, net reactive energy, and total apparent energy. These readings are available for each individual input channel as well as in summarized form, in accordance with selected embodiments of the invention.

FIG. 9 demonstrates the user interface 900 containing the current independent wiring mode setting 902 consistent with the configuration in FIG. 4. In this display, maximum and minimum values (max/min) 904 for this configuration for each input channel are shown, according to some embodiments of the present invention.

Figure 10:
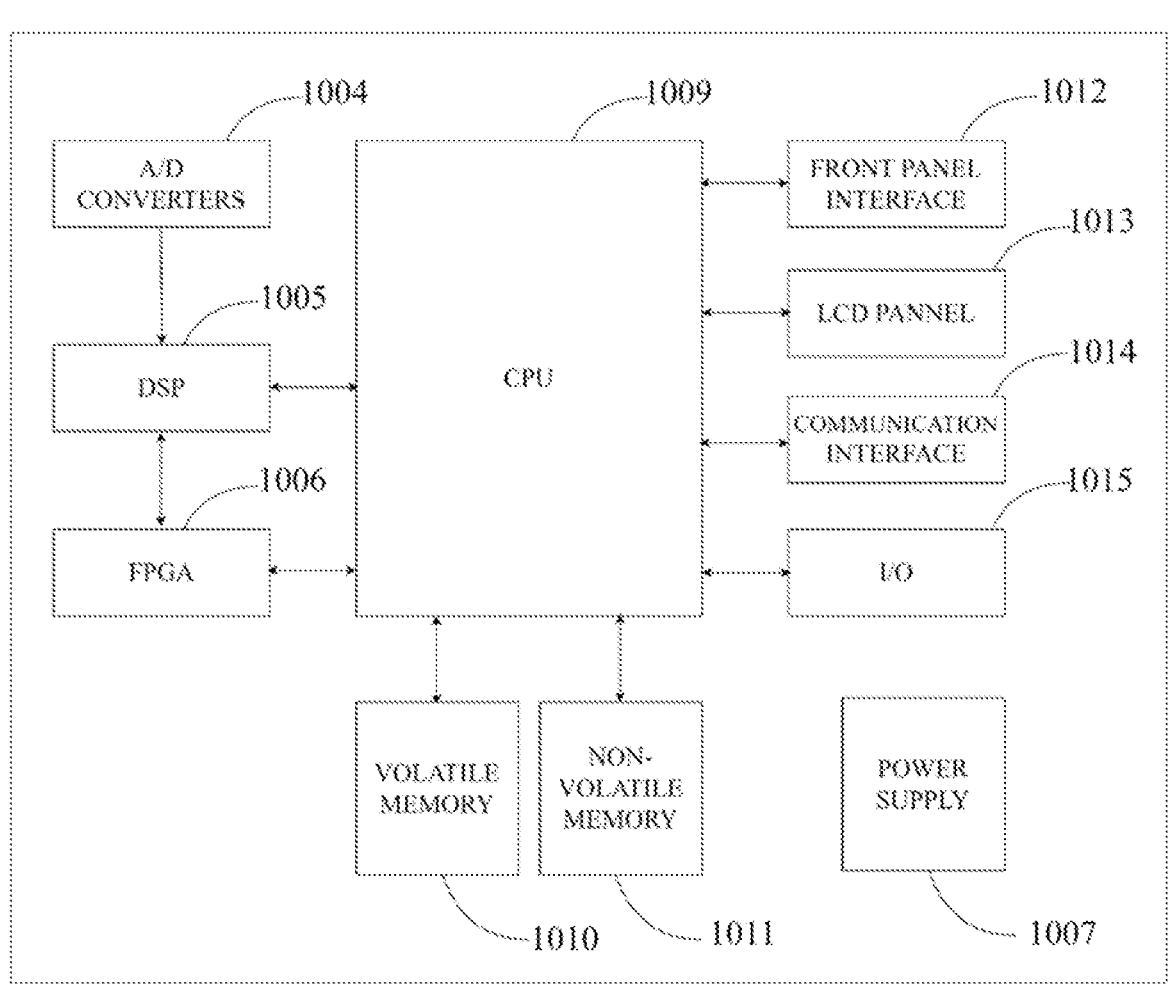
FIG. 10 is a block diagram of a power meter for monitoring power usage and power quality for any metered point within a power system according to some embodiments of the present invention.

FIG. 10 is a block diagram of a power meter 202 for monitoring power usage and power quality for any metered point within a power system.

The power meter 202 illustrated in FIG. 6 includes multiple analog-to-digital (A/D) converters 1004, a power supply 1007, volatile memory 1010, non-volatile memory 1011, a front panel interface 1012, and a processing module that includes at least one Central Processing Unit (CPU) and/or one or more Digital Signal Processors (DSP), two of which are shown DSP 1005 and CPU 1009. The power meter 202 also includes a Field Programmable Gate Array (FPGA) 1006 which performs several functions, including acting as a communications bridge for transferring data between the various processors (1005 and 1009).

The output of a current transformer or potential transformer will be coupled with the A/D converters 1004 which are configured to convert the analog voltage output from the transformer to a digital signal that can be processed by the DSP 1005.

A/D converters 604 are configured to convert an analog voltage output to a digital signal that is transmitted to a gate array, such as Field Programmable Gate Array (FPGA) 1006. The digital signal is then transmitted from the FPGA 1006 to the CPU 1009.

The CPU 1009 or DSP Processors 1005 are configured to receive digital signals from the A/D converters 1004 and perform the necessary calculations to determine power usage and control the overall operations of the power meter 202. In some embodiments, the CPU 1009 and DSP 1005 may be combined into a single processor to serve the functions of each component. In some embodiments, it is contemplated to use an Erasable Programmable Logic Device (EPLD), a Complex Programmable Logic Device (CPLD), or any other programmable logic device in place of the FPGA 1006. In some embodiments, the digital samples, which are output from the A/D converters 1004 are sent directly to the CPU 1009, effectively bypassing the DSP 1005 and the FPGA 1006 as a communications gateway.

The power supply 1007 provides power to each component of the power meter 202. In one embodiment, the power supply 1007 is a transformer with its primary windings coupled to the incoming power distribution lines to provide a nominal voltage at its secondary windings. In other embodiments, power may be supplied from an independent power source to the power supply 1007.

The front panel interface 1012 is shown coupled to the CPU 1009 which includes indicators, switches, and various inputs. The LCD panel 1013 is shown coupled to the CPU 1009 for interacting with a user and for communicating events, such as alarms and instructions. The LCD panel 1013 may provide information to the user in the form of alphanumeric lines, computer-generated graphics, videos, animations, etc.

An input/output (I/O) interface 1015 may be provided for receiving externally generated inputs from the power meter 202 and for outputting data, such as serial data, to other devices. In one embodiment, the I/O interface 1015 may include a connector for receiving various cards and/or modules that increase and/or change the functionality of the power meter 202.

The power meter 202 also includes volatile memory 1010 and non-volatile memory 1011. The volatile memory 1010 will store the sensed and generated data for further processing and for retrieval when requested to be displayed at the power meter 202 or from a remote location. The volatile memory 1010 includes internal storage memory, such as Random-Access Memory (RAM). The non-volatile memory 1011 includes removable memory, such as magnetic storage memory, optical storage memory (such as various types of CD or DVD media), solid-state storage memory, (such as a CompactFlash card, a Memory Stick, SmartMedia card, MultiMediaCard [MMC], SD [Secure Digital] memory), or any other memory storage that exists currently or will exist in the future. Such memory will be used for storing historical trends, waveform captures, event logs (including timestamps), and stored digital samples for later download to a client application, webserver, or PC application.

In a further embodiment, the power meter 202 will include a communication interface 1014, also known as a network interface, for enabling communications between the meter, and a remote terminal unit or programmable logic controller and other computing devices, microprocessors, desktop computers, laptop computers, other meter modules, etc. The communication interface 1014 may be a modem, Network Interface Card (NIC), wireless transceiver, or other interface. The communication interface 1014 will operate with hardwired and/or wireless connectivity. A hardwired connection may include, but is not limited to, physical cabling (such as parallel cables serial cables, RS232, RS485, USB cables, or Ethernet) and an appropriately configured communication port. The wireless connection may operate under any of the various wireless protocols including, but not limited to, Bluetooth™ interconnectivity, infrared connectivity, radio transmission connectivity (including computer digital signal broadcasting and reception commonly referred to as Wi-Fi or 802.11.X [where x denotes the type of transmission]), satellite transmission, or any other type of communication protocols, communication architecture, or systems currently existing or to be developed for wirelessly transmitting data.

The power meter 202 may communicate to a server or other computing device via the communication interface 1014. The power meter 202 may be connected to a communications network (such as the Internet) by any means. For example, a hardwired or wireless connection, such as dial-up, hardwired, cable, DSL, satellite, cellular, PCS, or wireless transmission (e.g., 802.11a/b/g) may be used. It is noted that the network may be a Local Area Network (LAN), Wide Area Network (WAN), the Internet, or any network that couples multiple computers to enable various modes of communication via network messages. Furthermore, the server will communicate using various protocols, such as Transmission Control Protocol/Internet Protocol (TCP/IP), File Transfer Protocol (FTP), or Hypertext Transfer Protocol (HTTP) or via secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, or via other secure protocols. The server may further include a storage medium for storing the data received from at least one IED or meter and/or storing data to be retrieved by the IED or meter.

In an additional embodiment, when a power event occurs, such as a voltage surge, voltage sag, or current short circuit, the power meter 202 may also have the capability of not only digitizing waveforms but storing the waveform and transferring that data upstream to a central computer, such as a remote server. The power event may be captured, stored to memory (e.g., non-volatile RAM), and additionally transferred to a host computer within the existing communication infrastructure either immediately, in response to a request from a remote device or computer, or later in response to a polled request. The digitized waveform will also allow the CPU 609 to compute other electrical parameters such as harmonics, magnitudes, symmetrical components, and phasor analysis.

In a further embodiment, the power meter 202 will execute an e-mail client and will send notification e-mails to the utility or directly to the customer when a power quality event occurs. This allows utility companies to dispatch crews to repair the condition. The data generated by the meters is used to diagnose the cause of the condition. The data is transferred through the infrastructure created by the electrical power distribution system. The e-mail client will utilize POP3 or another standard e-mail protocol.

The techniques of the present disclosure can be used to automatically maintain program data and provide field-wide updates upon which power meter firmware and/or software can be upgraded. An event command can be issued by a user, on a schedule, or through a digital communication that will trigger the power meter 202 to access a remote server and obtain the new program code. This will ensure that program data will be maintained, assuring the user that all information is displayed identically on all units.

Figure 1:
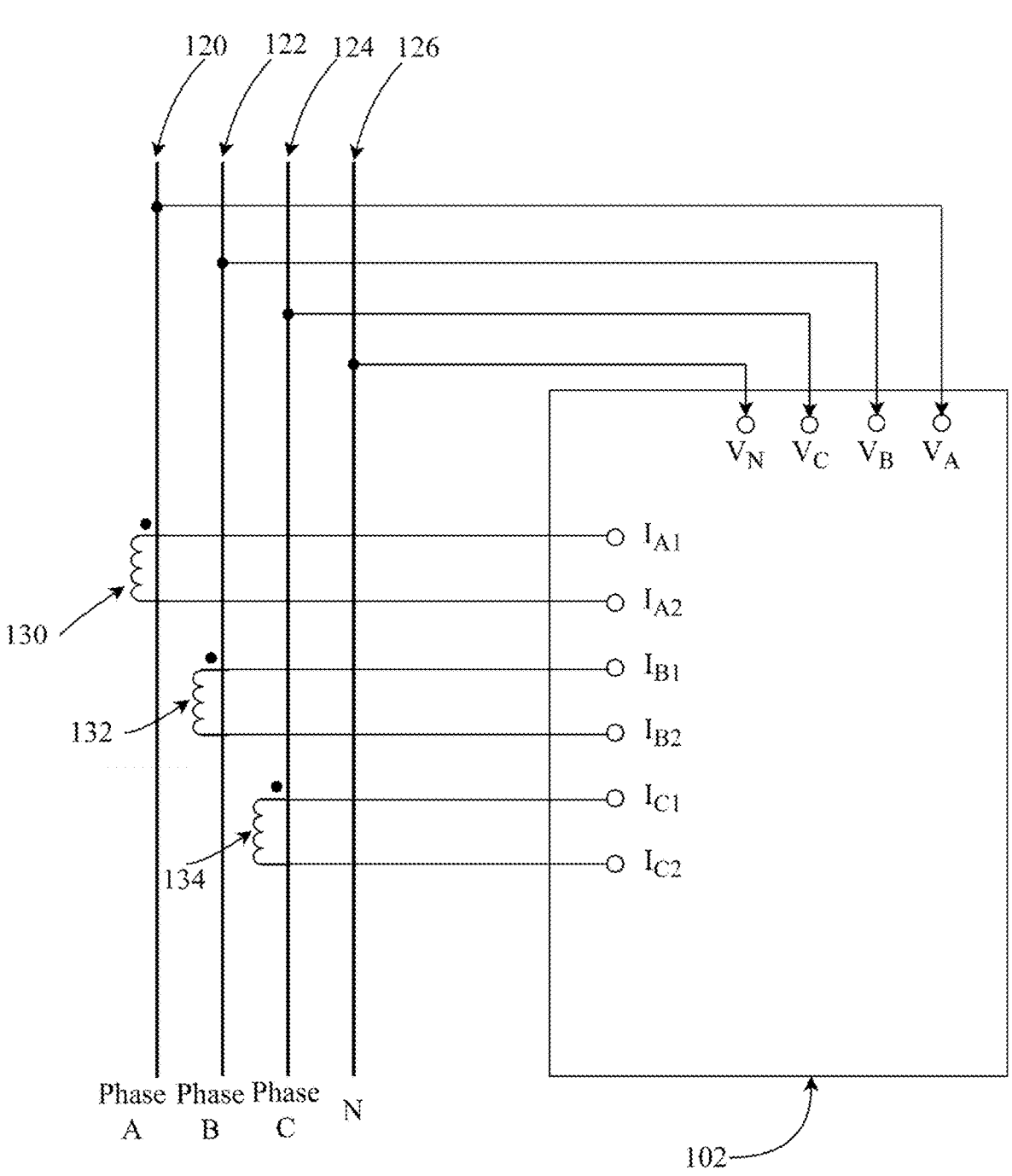
FIG. 1 is a diagram of a conventional three-phase electrical distribution system, showcasing three-phase power meter measuring parameters according to prior art.
Figure 11:
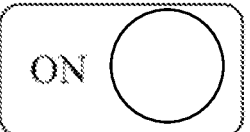
FIG. 11 is an exemplary user interface that affords users the capability to manage the channel configuration functionality, according to some embodiments of the present invention.

FIG. 11 depicts a user interface that affords users the capability to manage the channel configuration functionality. Through this interface, users have the option to activate or deactivate channel configuration. When channel configuration is deactivated, the power meter reverts to conventional operation, utilizing predefined channel pairs for measurement, as exemplified in FIG. 1. This interface thereby offers users the flexibility to switch between a standard measurement mode and a customized channel configuration mode, as per their measurement requirements.

While the foregoing descriptions illustrate the present invention in the context of a three-phase power meter, it should be recognized that the principles and teachings of the invention are equally applicable to multi-channel power meters. Those of ordinary skill in the art will appreciate that the inventive concepts disclosed herein can be adapted for use in power meters capable of monitoring multiple channels, thereby extending the utility and application of the invention beyond the specific example of a three-phase power meter.

Embodiments of the teachings of the present disclosure have been described in an illustrative manner. It is to be understood that the terminology that has been used, is intended to be in the nature of words of description rather than of limitation. Many modifications and variations of the embodiments are possible in light of the above teachings. Therefore, within the scope of the appended claims, the embodiments can be practiced other than specifically described.

What is claimed is:

1. A power meter comprising:
   at least one sensor configured for sensing electrical parameters of electrical power distributed from an electrical distribution system to a load;
   at least one analog-to-digital converter coupled to the at least one sensor and configured for converting an analog signal output from the at least one sensor to digital data; a user interface comprising selection interface elements;
   at least one processing module coupled to the at least one analog-to-digital converter, the at least one processing module is configured to:
   retrieve a user-defined channel configuration stored in a channel configuration file in a memory, the user-defined channel configuration defining a user-selectable correspondence between each current input channel of a plurality of current input channels and a corresponding configured voltage, wherein the corresponding configured voltage is one of a line-to-line voltage or a line-to-neutral voltage selected by a user via the selection interface elements of the user interface;
   compute first electrical parameters for each channel of the plurality of current input channels based on the measured voltage for the corresponding configured voltage and the measured current flowing through the associated current input channel, wherein the measured voltage and the measured current are calculated based on the digital data provided by the at least one analog-todigital converter, and wherein the user interface further allows users to selectively enable or disable the user-defined channel configuration, wherein disabling the user-defined channel configuration causes the power meter to default to utilizing predefined channel pairs for measurements, and wherein enabling the user-defined channel configuration allows for operation in a customized channel configuration mode.

2. The power meter of claim 1, the at least one processing module is further configured to:
   access a summation configuration stored within the memory, the summation configuration specifying a subset of current input channels designated for aggregate computation;
   calculate cumulative electrical parameters by summing the first electrical parameters across the specified subset of input channels as defined by the summation configuration.

3. The power meter of claim 2, further comprising a user interface configured to allow users to customize the summation configuration based on specific requirements of the electrical distribution system.

4. The power meter of claim 2, further comprising a user interface configured to display the cumulative electrical parameters.

5. The power meter of claim 1, wherein the power meter is a three-phase power meter or a multi-channel power meter.

6. The power meter of claim 1, wherein the first electrical parameters include current, active power, reactive power, apparent power, active power demand, reactive power demand, apparent power demand, import active energy, export active energy, import reactive energy and export reactive energy.

7. The power meter of claim 1, further comprising a user interface configured to display the first electrical parameters, with the current channel configuration.

8. A method of measuring electrical parameters in an electrical distribution system, the method comprising:
   sensing electrical parameters of electrical power distributed to a load with at least one sensor;
   converting an analog signal output from the at least one sensor to digital data with at least one analog-to-digital converter; providing a user interface comprising selection interface elements enabling a user to specify a particular matching voltage for each current input channel of a plurality of current input channels, wherein the matching voltage is one of a line-to-line voltage or a line-to-neutral voltage;
   storing user-defined matching voltage selections for the plurality of current input channels in a channel configuration file in a memory;
   retrieving a user-defined channel configuration stored in the channel configuration file from the memory, the user-defined channel configuration defining a user-selectable correspondence between each current input channel of the plurality of current input channels and a corresponding configured voltage;
   computing first electrical parameters for each channel of the plurality of current input channels based on the corresponding configured voltage and the current flowing through the associated current input channel using the digital data; and selectively enabling or disabling the channel configuration via the user interface, wherein disabling the channel configuration causes a power meter to default to utilizing predefined channel pairs for measurements, and wherein enabling the channel configuration allows for operation in a customized channel configuration mode.

9. The method of claim 8, further comprising:

accessing a summation configuration stored within the memory, the summation configuration specifying a subset of current input channels designated for aggregate computation;

calculating cumulative electrical parameters by summing the first electrical parameters across the specified subset of input channels as defined by the summation configuration.

10. The method of claim 8, wherein the computing step includes determining electrical parameters selected from the group consisting of current, active power, reactive power, apparent power, active power demand, reactive power demand, apparent power demand, import active energy, export active energy, import reactive energy, and export reactive energy.

* * * * *